US012809251B2

(12) United States Patent
Nees et al.

(10) Patent No.: US 12,809,251 B2
(45) Date of Patent: Nov. 24, 2026

(54) METHOD OF PREPARING AN EMBOSSED STRUCTURE, EMBOSSED STRUCTURE AND USE THEREOF

(71) Applicants: Joanneum Research Forschungsgesellschaft mbH, Graz (AT); Allnex Belgium SA/NV, Drogenbos (BE)

(72) Inventors: Dieter Nees, Thannhausen (AT); Johannes Götz, Gleisdorf (AT); Stephan Ruttloff, Anger (AT); Dirk Bontinck, Ertvelde (BE)

(73) Assignees: JOANNEUM RESEARCH FORSCHUNGSGESELLSCHAFT MBH, Graz (AT); ALLNEX BELGIUM SA/NV, Drogenbos (BE)

( * ) Notice: Subject to any disclaimer, the term of this patent is extended or adjusted under 35 U.S.C. 154(b) by 682 days.

(21) Appl. No.: 18/008,345

(22) PCT Filed: May 21, 2021

(86) PCT No.: PCT/EP2021/063635
§ 371 (c)(1),
(2) Date: Dec. 5, 2022

(87) PCT Pub. No.: WO2021/249744
PCT Pub. Date: Dec. 16, 2021

(65) Prior Publication Data

US 2023/0280650 A1 Sep. 7, 2023

(51) Int. Cl.
*G03F 7/00* (2006.01)
*G03F 7/004* (2006.01)
*G03F 7/027* (2006.01)

(52) U.S. Cl.
CPC .......... *G03F 7/0002* (2013.01); *G03F 7/0048* (2013.01); *G03F 7/027* (2013.01)

(58) Field of Classification Search
CPC ...... G03F 7/0002; G03F 7/0048; G03F 7/027; G03F 7/0388
See application file for complete search history.

(56) References Cited

U.S. PATENT DOCUMENTS

2013/0099423 A1* 4/2013 Umekawa ............. G03F 7/0002 522/123
2017/0197459 A1 7/2017 Gourdin et al.
2017/0343900 A1* 11/2017 Nees ........................ G03F 7/031
2017/0349707 A1* 12/2017 Nees ...................... G03F 7/0757
2019/0315959 A1 10/2019 Hazell et al.
2021/0129415 A1 5/2021 Kues et al.

FOREIGN PATENT DOCUMENTS

CN 110989297 A 4/2020
JP 2019076889 A * 5/2019
WO 2015158595 A1 10/2015
WO 2018095823 A1 5/2018
WO 2019185833 A1 10/2019

OTHER PUBLICATIONS

English Translation of JP2019076889A (Year: 2019).*
Shin-Nakamura Chemical Co., Ltd., NK Ester (Acrylic ester) Multifunctional-Acrylate, https://www.shin-nakamura.com/en/products/acrylate02?scroll_id=multi-acrylate03 (Year: 2026).*
European Patent Office, International Search Report and Written Opinion issued Aug. 16, 2021, for International Patent Application No. PCT/EP2021/063635.
Decker et al., Dual-Curing of Waterborne Urethane-Acrylate Coatings by UV and Thermal Processing, Macromolecular Materials and Engineering, 2003, vol. 288, pp. 17-28.
Masson et al., UV-radiation curing of waterbased urethane-acrylate coatings, Progress in Organic Coatings 39, 2000, pp. 115-126.
Yang et al., Newly UV-curable polyurethane coatings prepared by multifunctional thiol- and ene-terminated polyurethane aqueous dispersions mixtures: Preparation and characterization, Polymer 50 (2009) 1717-1722.

* cited by examiner

*Primary Examiner* — Xiao S Zhao
*Assistant Examiner* — Victoria Bartlett
(74) *Attorney, Agent, or Firm* — Duane Morris LLP

(57) ABSTRACT

A method of preparing an article having an embossed micro- or nanostructured surface using an aqueous dispersion of a curable prepolymer, an article obtainable by the method and the use of the article.

14 Claims, No Drawings

METHOD OF PREPARING AN EMBOSSED STRUCTURE, EMBOSSED STRUCTURE AND USE THEREOF

FIELD OF THE INVENTION

The present invention relates to a method of preparing an embossed micro- or nanostructured article using embossing lacquer formulations based on aqueous dispersions, a structured article obtained by said method and the use of said structured article.

BACKGROUND ART

The production of nanostructured components in industrial manufacturing is gaining importance due to the rapid rise of nanotechnology in recent years. Nanostructured components are typically manufactured from photopolymerizable prepolymer compositions. Finest structures are increasingly used to achieve specific additional functionalities, e.g. self-cleaning of surfaces or even to evoke decorative visual effects or anti-reflection, etc., particularly in safety technology, the area of decor, product marketing, the surface finishing of various materials, and other areas. For this purpose, structures processed through nanotechnology, which are produced from special prepolymer compositions, are used. An even more significant purpose of these micro and nanostructured foils is with electronic, optical, sensory, and magnetic components, such as integrated circuits, displays, micro-optics, etc., as small structural sizes are the decisive factor for the functionality of these articles. Thus, for industrial foil manufacturing, micro and nanostructuring techniques, such as roll-to-roll, roll-to-plate or sheet-to-sheet emboss technologies, play an important role and demand ever new and improved moldable foils or compositions, from which these structured foils can be manufactured A technology that enables structures to be manufactured with minimal dimensions in the nanometer range in a parallel process is so-called nanoimprint lithography (NIL), which presents a highly precise embossing process and with which it is possible to form even the smallest structures on the respective substrate.

Roll-to-roll nanoimprint lithography processes have been used industrially. Crucial for this method is that adhesion of the embossing lacquer on the embossing tool is prevented in order to be able to subsequently achieve defect-free demolding of the embossed object. Currently, two different types of embossing tools are used for a roll-to-roll nanoimprint process, namely the embossing profile can either be produced directly on an embossing roller or on thin flexible sheet metal or foil material, which is set firmly around a roller. So-called shims consisting of nickel are used as these metallic foils that are capable of being arranged around a roller. As an alternative, embossing stamps consisting of polymer materials can be used, wherein polymer materials potentially have lower surface energies than nickel, which reduces the embossing lacquer adhesion during the emboss process.

Embossed structures prepared from UV lacquers based on urethane acrylate (sometimes abbreviated as "UA" herein) oligomers are widely used, since UA oligomers have the best mechanical and chemical stability. However, the high viscosity of UA oligomers renders the application of uniformly thin films difficult.

The high viscosity of UA oligomers is traditionally reduced in UV-NIL embossing lacquer formulations by the addition of acrylate monomers as reactive diluents. However, acrylate monomers are generally irritating and hazardous, and they adversely affect the mechanical and chemical stability of the urethane acrylates since they cannot form hydrogen bonds.

EP 2 590 801 A1 discloses UV embossing lacquers containing at least 60 wt % of oligomer component urethane acrylate oligomers and 2-40 wt % of reactive diluents. The lacquers are used for weathering resistant and abrasion resistant micro- and nanostructured surfaces.

UV lacquers for coatings other than embossed structures are increasingly based on aqueous UA dispersions, which allow uniform application of a thin film on a substrate and the provision of extremely stable coatings after UV curing and/or crosslinking. The viscosity required for good application ability can be adjusted easily in aqueous UA dispersions.

Problem to be Solved by the Invention

The prior art does not disclose a method using aqueous prepolymer dispersions as embossing lacquers.

Therefore, the problem underlying the present invention was to provide a method of preparing micro- or nanostructured articles using an environment-friendly and low-toxic embossing lacquer that is improved in terms of easy adjustment of its viscosity without the need of using reactive diluents.

SUMMARY OF THE INVENTION

The problem underlying the present invention was solved by providing the method according to the present invention. The present invention furthermore provides an embossed article und its use.

The subject-matter of the present application is defined in the following embodiments [1] to [15] and [1-1] to [14-3].

[1] A method of preparing an article having a micro- or nanostructured surface, the method comprising the following steps in the indicated order: (a) providing an aqueous dispersion of a prepolymer having at least one polymerizable carbon-carbon double bond, wherein the viscosity of the aqueous dispersion is less than 2000 mPa·s, (b) applying a film of the aqueous dispersion on the surface of a substrate, (c) drying the film, (d) embossing the dried film to form micro- or nanostructures on the surface of the dried film, and (e) curing the embossed film to obtain the article having a micro- or nanostructured surface.

[1-1] In the method of [1], the step (d) of embossing the dried film is preferably carried out without embossing the substrate.

[2] The method according to [1] or [1-1], wherein the prepolymer is selected from the group consisting of urethane acrylates, vinyl acrylates, epoxy acrylates, polyester acrylates, polyacrylates, polyether acrylates, and polyolefin acrylates.

[2-1] Urethane acrylates are preferred in [2].

[3] The method according to any of the preceding embodiments, wherein the prepolymer contains hydrophilic residues, preferably other than acrylic acid residues, selected from acidic or ionic residues.

[4] The method according to [3], wherein the hydrophilic residues are selected from the group consisting of carboxylic acid, sulfonic acid, carboxylate, and sulfonate residues.

[4-1] A combination of the features of [1] or [1-1] and the features of [2-1] and [4] is preferred.

[5] The method according to any of the preceding embodiments, wherein the weight average molecular weight of the prepolymer is at least 2000 g/mol.

[6] The dried dispersion of the aqueous dispersion used in [1] or [1-1] preferably has a viscosity of more than 50 Pa-s. [6-1] A combination of the features of [1] or [1-1] and the features of [5] and [6] is more preferred. [6-2] A combination of the features of [6-1] and [4-1] is even more preferred.

[7] The method according to any of the preceding embodiments, which contains, on a dry weight basis, 0 wt % to less than 2 wt %, preferably less than 0.1 wt % of a reactive diluent that is a compound different from the prepolymer.

[8] The method according to [7], wherein the reactive diluent is a monomer.

[8-1] Preferably, the prepolymer has a weight average molecular weight of more than 2000 g/mol, and the reactive diluent is a monomer and has a weight average molecular weight of less than 300 g/mol.

[9] The method according to any of the preceding embodiments, wherein the aqueous dispersion contains a surfactant that is a compound different from the prepolymer and from the optionally contained reactive diluent and that is selected from the group consisting of alkyl-(meth)acrylates, polysiloxane(meth)acrylates, perfluoroalkyl (meth)acrylates, perfluoropolyether(meth)acrylates, alkyl vinyl ethers, polysiloxane vinyl ethers, perfluoroalkyl vinyl ethers, and perfluoropolyether vinyl ethers. In other words, the surfactant is selected from said group, while the prepolymer and the optionally contained reactive diluent are not selected from said group.

[10] The method according to [9], which contains, on a dry weight basis, 0.1 wt % to 3 wt % of the surfactant.

[10-1] A combination of the features of [1] or [1-1] and the features of [7] and [10] is preferred. [10-2] A combination of the features of [6] and [10-1] is more preferred.

[11] The method according to any one of the preceding embodiments, wherein the dry material of the aqueous dispersion has a surface energy of 10 mN/m to 40 mN/m.

[11-1] A combination of the features of [11] and [6] is preferred. [11-2] A combination of the features of [11] and [10-1] is more preferred.

[12] The method according to [1] or [1-1], wherein the prepolymer is a urethane acrylate containing hydrophilic residues preferably other than acrylic residues selected from the group consisting of carboxylic acid, sulfonic acid, carboxylate and sulfonate residues, wherein the weight average molecular weight of the prepolymer is at least 2000 g/mol, the aqueous dispersion contains less than 2 wt % of a monomeric reactive diluent, and wherein the prepolymer is cured by UV radiation.

[12-1] A combination of the features of [12] and [6] is preferred. [12-2] A combination of the features of [12] and [10-1] is more preferred.

[13] The method according to any one of the preceding embodiments, wherein the prepolymer has a number of double bond equivalents divided by the total mass of the prepolymer of less than 2.5 meq/g.

[13-1] A combination of the features of [1] or [1-1] and the features of [5], and [13] is preferred. [13-2] A combination of the features of [12] and [13] is more preferred.

[14] An article having a micro- or nanostructured surface obtainable by the method of any one of the above embodiments.

[14-1] Preferably, the article is obtainable by the method of [12], [13], [13-1] or [13-2] and has a surface energy of less than 25 mN/m.

[14-2] The present invention also relates to an article having a micro- or nanostructured surface containing a substrate and an embossed and micro- or nanostructured film on the substrate, wherein the film contains a cured UA prepolymer having hydrophilic residues selected from the group consisting of carboxylic acid, sulfonic acid, carboxylate, and sulfonate residues. The carboxylic acid and carboxylate are preferably not derived from acrylic acid.

[14-3] Preferably, the embossed and cured film of the article of [14], [14-1] or [14-2] contains a polymer having an acid number of 5.0 to 30 mg KOH/g, preferably 10 to 30 mg KOH/g.

[15] The use of one of the articles recited above in shark fin technology, moth eye technology, antifouling technology and refractive and superhydrophobic surface technology.

Furthermore, the subject-matter of the present application is defined in the following embodiments [1] to [15] and [2-1] to [14-3]. [1] A method of preparing an article having a micro- or nanostructured surface, the method comprising the following steps in the indicated order: (a) providing an aqueous dispersion of a prepolymer having at least one polymerizable carbon-carbon double bond, (b) applying a film of the aqueous dispersion on the surface of a substrate, (c) drying the film, (d) embossing the dried film to form micro- or nanostructures on the surface of the dried film, and (e) curing the embossed film to obtain the article having a micro- or nanostructured surface.

[2] The method according to [1], wherein the prepolymer is selected from the group consisting of urethane acrylates, vinyl acrylates, epoxy acrylates, polyester acrylates, polyacrylates, polyether acrylates, and polyolefin acrylates. [2-1] Urethane acrylates are preferred in [2].

[3] The method according to any of the preceding embodiments, wherein the prepolymer contains hydrophilic residues, preferably other than acrylic acid residues, selected from acidic or ionic residues.

[4] The method according to [3], wherein the hydrophilic residues are selected from the group consisting of carboxylic acid, sulfonic acid, carboxylate, and sulfonate residues. [4-1] A combination of the features of [1], [2-1], and [4] is preferred.

[5] The method according to any of the preceding embodiments, wherein the weight average molecular weight of the prepolymer is at least 2000 g/mol.

[6] The method according to any of the preceding embodiments, wherein the viscosity of the aqueous dispersion is less than 2000 mPa·s. [6-1] The dried dispersion of the aqueous dispersion used in [6] preferably has a viscosity of more than 50 Pa-s. [6-2] A combination of the features of [1], [5], and [6-1] is more preferred. [6-3] A combination of the features of [6-2] and [4-1] is even more preferred.

[7] The method according to any of the preceding embodiments, which contains, on a dry weight basis, 0 wt % to less than 2 wt %, preferably less than 0.1 wt % of a reactive diluent that is a compound different from the prepolymer.

[8] The method according to [7], wherein the reactive diluent is a monomer. [8-1] Preferably, the prepolymer has a weight average molecular weight of more than 2000 g/mol, and the reactive diluent is a monomer and has a weight average molecular weight of less than 300 g/mol.

[9] The method according to any of the preceding embodiments, wherein the aqueous dispersion contains a surfactant that is a compound different from the prepolymer and from the optionally contained reactive diluent and that is selected from the group consisting of alkyl-(meth)acrylates, polysiloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers. In other words, the surfactant is selected from said group, while the prepolymer and the optionally contained reactive diluent are not selected from said group.

[10] The method according to [9], which contains, on a dry weight basis, 0.1 wt % to 3 wt % of the surfactant. [10-1] A combination of the features of [1], [7] and [10] is preferred. [10-2] A combination of the features of [6-1] and [10-1] is more preferred.

[11] The method according to any one of the preceding embodiments, wherein the dry material of the aqueous dispersion has a surface energy of 10 mN/m to 40 mN/m. [11-1] A combination of the features of [11] and [6-1] is preferred. [11-2] A combination of the features of [11] and [10-1] is more preferred.

[12] The method according to [1], wherein the prepolymer is a urethane acrylate containing hydrophilic residues preferably other than acrylic residues selected from the group consisting of carboxylic acid, sulfonic acid, carboxylate and sulfonate residues, wherein the weight average molecular weight of the prepolymer is at least 2000 g/mol, the aqueous dispersion has a viscosity of less than 5000 mPa·s, preferably less than 2000 mPa·s and contains less than 2 wt % of a monomeric reactive diluent, and wherein the prepolymer is cured by UV radiation.

[12-1] A combination of the features of [12] and [6-1] is preferred. [12-2] A combination of the features of [12] and [10-1] is more preferred.

[13] The method according to any one of [1] to [12], wherein the prepolymer has a number of double bond equivalents divided by the total mass of the prepolymer of less than 2.5 meq/g. [13-1] A combination of the features of [1], [5], [6], and [13] is preferred. [13-2] A combination of the features of [12] and [13] is more preferred.

[14] An article having a micro- or nanostructured surface obtainable by the method of any one of the above embodiments. [14-1] Preferably, the article is obtainable by the method of [12], [13], [13-1] or [13-2] and has a surface energy of less than 25 mN/m. [14-2] The present invention also relates to an article having a micro- or nanostructured surface containing a substrate and an embossed and micro- or nanostructured film on the substrate, wherein the film contains a cured UA prepolymer having hydrophilic residues selected from the group consisting of carboxylic acid, sulfonic acid, carboxylate, and sulfonate residues. The carboxylic acid and carboxylate are preferably not derived from acrylic acid. [14-3] Preferably, the embossed and cured film of the article of [14], [14-1] or [14-2] contains a polymer having an acid number of 5.0 to 30 mg KOH/g, preferably 10 to 30 mg KOH/g.

[15] The use of one of the articles recited above in shark fin technology, moth eye technology, antifouling technology and refractive and superhydrophobic surface technology.

Advantages of the Invention

The use of an aqueous dispersion makes it possible to adjust its properties. For instance, the viscosity can be easily adjusted by varying the water content of the aqueous dispersion. The aqueous dispersions used in the present invention do not require reactive diluents that adversely affect the mechanical properties of polymers. Hence, the mixing ratio of a polymer to reactive diluent can be selected from a broad range. In addition, the omission of reactive diluents renders the aqueous dispersion environment-friendly and less toxic and results in a less tacky embossing lacquer.

The aqueous dispersion used in the present invention can be used as embossing lacquers that are particularly well suited for use in roll-to-roll, roll-to-plate or sheet-to-sheet processes and demonstrate excellent molding properties, such that they can be used on an industrial scale. Due to the potential extremely low surface energy and, therefore, adhesion energy, it is also possible to conduct multiple generations of imprints and moldings without damage occurring due to adhered embossing lacquer to the imprint tool.

In addition, it is possible to prepare embossing lacquers with extraordinary properties such as controllable mechanical properties over wide ranges, e.g. tensile strength, elongation at break and modulus of elasticity, controllable surface energy, e.g. hydrophilicity or hydrophobicity and adhesion, high resistance to solvents and chemicals, high scratch resistance and abrasion resistance as well as high UV and weather stability.

The embossed structures obtained by the method according to the present invention can be used for microstructured or nanostructured surfaces, e.g. for reflective or hydrophobic surfaces.

EMBODIMENTS OF THE INVENTION

The method of preparing an article having a micro- or nanostructured surface comprises the steps recited in claim 1. The article of the present invention has a "micro- or nanostructured" surface. This means that the surface of the article contains indentations or protrusions in the range of micrometers, i.e. from 1 μm to less than 1000 μm, or in the range of nanometers, i.e. from 1 nm to less than 1000 nm. The surface may contain both microstructures and nanostructures.

A film, i.e. a thin layer, of the aqueous dispersion is applied on a substrate. The film may be applied in a thickness of 20 nm to 2000 μm, preferably 200 nm to 2000 μm, more preferably 2 μm to 1000 μm. The substrate may be made of any kind of material, e.g. glass, polymers, metals, wood, concrete, and stone. The substrate is preferably solid or has at least a viscosity that is at least ten times higher than the viscosity of the dried film in step (d). Preferably, this has effect that the substrate is not embossed in step (d) of embossing the dried film. The aqueous dispersion is dried. The composition obtained by drying the aqueous dispersion used in the present invention is sometimes simply referred to as "the dried dispersion" herein. The dried dispersion is an embossing lacquer that can be used for embossing in the method of the present invention. Herein, the terms "embossing lacquer" and "dried dispersion" are used synonymously. The water in the aqueous dispersion can be removed by heating and/or air convection. In the present invention, the term "drying" covers a process of partly or fully removing water. A dried dispersion may contain small amounts of water or no water, e.g. 0 to 5 wt %, preferably 0 to 2 wt % of water. In one embodiment, the dried dispersion does not contain water. In another embodiment, the dried dispersion may contain 0.1 to 5 wt % of water. The embossing step is carried out after the water content of the aqueous dispersion has been reduced to such an extent that the film of the dispersion has the desired viscosity and is not tacky. The substrate is preferably a solid or has at least a high viscosity. The embossing step is preferably carried out such that the dried film is embossed, while the substrate is not embossed at the same time. To achieve this selective embossing, the viscosity of the dried film, the viscosity of the substrate and/or the embossing conditions can be suitably adjusted. The thickness of the embossed film may be 10 nm to 1000

μm, preferably 100 nm to 1000 μm, more preferably 1 μm to 500 μm. Curing is preferably carried out by UV irradiation. In the case of UV irradiation, the aqueous dispersion used in the present invention contains a photoinitiator.

The micro- or nanostructured surface of the article obtained in step (e) contains protrusions and indentations in the embossed film. Preferably, the ratio of the maximum thickness of the embossed film, i.e. the thickness at the position of the top of the protrusions, to the minimum thickness of embossed film, i.e. the thickness at the position of the bottom of the indentations, is at least two. In other words, the embossed indentations are very deep in relation to the total thickness of the embossed film. Thus, the embossed film as the functional layer of the article can be kept relatively thin.

An embossed structure is obtainable by the method according to the present invention. The embossed structure may contain water, e.g. 0.1 to 5 wt %. If water is not fully removed in step (c) and is still present after curing, it may be removed after step (e). The article of the present invention contains a substrate and a cured polymer film having micro- or nanostructures on its surface. The article is obtainable by the method of the present invention.

The article is prepared by using an aqueous dispersion of a prepolymer as a starting material. The dispersibility of the prepolymer in water requires hydrophilic components, e.g. acidic or ionic residues in the molecule of the prepolymer. Hydrophilic components would have an adverse effect in non-aqueous, e.g. purely organic compositions, and are thus not contained in prepolymers of such compositions. Therefore, the aqueous dispersion and embossing lacquer used in the present invention differ from conventional non-aqueous embossing lacquers. As a result, the cured products obtained from the respective embossing lacquers also differ.

Due to the micro- or nanostructures on the surface of the article of the present invention, the surface has specific properties allowing the article to be used in shark skin technology (for viscous drag reduction), moth eye technology, such as moth-eye antireflective films for e.g. solar cells or glass surfaces, antifouling technology, refractive and superhydrophobic surface technology, and biomimetic surfaces such as riblet foils for airplanes.

In the present description, compounds and components are generally described in the singular form, e.g. "a" component or "containing a" component. It is emphasized that these formulations do not at all exclude the presence of more than one of the indicated component or compound, unless indicated otherwise. In the present invention, the standards and norms mentioned refer to the latest version available at the time this application was filed, unless indicated otherwise.

The Aqueous Dispersion

The aqueous dispersion used in the method according to the present invention may sometimes be simply referred to as "the aqueous dispersion" in the following.

The aqueous dispersion preferably contains 10 to 90 wt % of water and 90 to 10 wt % of prepolymer, more preferably 40 to 80 wt % of water and 20 to 60 wt % of prepolymer, even more preferably 50 to 70 wt % of water and 30 to 50 wt % of prepolymer. Preferably, the total of the content of water and the content of the prepolymer makes up 80 to 100 wt % of the aqueous dispersion. In one embodiment, the aqueous dispersion contains 50 to 70 wt % of water and 30 to 50 wt % of prepolymer, the total of the content of water and the content of the prepolymer making up 80 to 100 wt % of the aqueous dispersion.

The dispersion is aqueous, i.e. it is water-based. It is preferably solvent-free, if not expressly indicated otherwise. In some embodiments, a small amount of solvents, e.g. 0.01 wt % to 10 wt % or 0.1 wt % to 5 wt %, may be contained in the aqueous dispersion.

The dispersion may contain other components such a reactive diluent or a photoinitiator. The photoinitiator may be selected from the group of thioxanthones, ketosulfones, (alkyl) benzoyl phenyl phosphine oxides, 1-hydroxy alkyl phenyl ketones or 2,2-dimethoxy-1,2-diphenyl ethane-1-one. The photoinitiator may be contained in a quantity of 0.1 wt % to 10 wt %, particularly 0.5 wt % to 5 wt %. Other additives may be added to the curable precursor of the polymeric material that may provide certain desired properties to the polymeric material comprised in the durable micro- and/or nano-structured surface or that may allow for easier processing. Examples of such additives are colorants, rheology agents, levelling agents, anti-skin agents, UV stabilizers, antioxidants, and anti-foam additives.

Furthermore, the invention aims to use the aqueous dispersion to form a dried dispersion used as an embossing lacquer.

Depending on the intended uses, the viscosity of the aqueous dispersion can be adjusted by varying the content of water and/or reactive diluent. The dispersion preferably has a viscosity of 0.01 to 10 Pa-s, more preferably 10 to 2000 mPa·s, most preferably 50 to 1000 mPa·s. A viscosity within this range results in a good fluidity of the aqueous dispersion and a uniform coating of surfaces to be molded. Since the viscosity of the aqueous dispersion depends on its content of water, the viscosity is increased upon drying. In a preferred embodiment, the viscosity of an aqueous dispersion used in the present invention is less than 10 Pa-s, while its viscosity after drying is more than 30 Pa-s. In a more preferred embodiment, the viscosity of an aqueous dispersion used in the present invention is less than 2000 mPa·s, while its viscosity after drying is more than 50 Pa-s.

In the present invention, the viscosity is measured at 23° C. according to DIN EN ISO 2555 (Brookfield method).

Since the viscosity can be adjusted by varying the water content, a reactive diluent is not required. Hence, the aqueous dispersion used in the present invention preferably does not contain a reactive diluent. However, a reactive diluent may be contained e.g. for adjusting the viscosity of the aqueous dispersion and/or the embossing lacquer. The dispersion may contain 0 to less than 2 wt %, preferably less than 0.1 wt %, more preferably 0 wt % of a reactive diluent described below.

In one embodiment, the polymerizable components of the aqueous dispersion consist of the prepolymer having at least one polymerizable carbon-carbon double bond, and, if contained, a component having at least two thiol groups and, if contained, a polymerizable surfactant. Thus, a reactive diluent having at least one polymerizable double bond is excluded from the aqueous dispersion.

The embossing lacquer, i.e. the dried dispersion, used in the present invention has a surface energy of preferably 10 mN/m to 60 mN/m, more preferably 10 to 40 mN/m.

The components and the composition of the aqueous dispersion may be adjusted to enable the preparation of an embossed and cured article having a surface energy of less than 25 mN/m, wherein the surface energy is determined in a test method comprising the steps of drying the aqueous dispersion, embossing the dried dispersion against a nickel oxide surface that contains a self-assembling fluorinated alkyl monolayer and has a surface energy of less than 15 mN/m, polymerizing the prepolymer, and determining the surface energy of the embossed surface of the polymer.

Examples of aqueous prepolymer dispersions and their preparations are disclosed in F. Masson, R. Schwalm "UV-radiation curing of water based urethane-acrylate coatings", Progress in Organic Coatings 39 (2000) 115-126. The water release upon heating of an aqueous UA dispersion is shown to depend on the temperature and on the film thickness. The drying of a 30 μm thick coating of an aqueous UA dispersion is completed in less than 2 min upon heating in an oven at 80° C. The polymerization kinetics depend on parameters such as the type of photoinitiator, the sample temperature, the chemical structure of the functionalized oligomer and its acid content. The water uptake is directly related to the carboxylic acid content of the urethane-acrylate polymer.

A series of UV-curable polyurethane coatings prepared by blending multifunctional thiol- and ene-terminated polyurethane aqueous dispersions are disclosed in Z. Yang, C. E. Hoyle, "Newly UV-curable polyurethane coatings prepared by multifunctional thiol- and ene-terminated polyurethane aqueous dispersions mixtures: Preparation and characterization", Polymer 50 (2009) 1717-1722. The resulting polyurethane coatings show good solution stability and high photopolymerization activity even after a long time. The incorporation of a waterborne polyurethane chain into both the multifunctional thiols and ene monomers promotes their solution stability and avoided any reaction between thiols and ene groups as a result of their high reacting activity in non-aqueous systems. This method allows for the preparation of high-performance UV-curable polyurethane aqueous coatings based on thiol-ene chemistry systems.

Examples of aqueous dispersions usable in the method according to the present invention are disclosed in EP 2 288 638 B1. In a preferred embodiment of the present invention, the method uses an aqueous dispersion comprising at least 90 wt % of high molecular weight ethylenically unsaturated polyurethane (A) and 0-5 wt % of one or more photoinitiator (s), wherein (A) is obtainable by a reaction of at least one polyisocyanate compound (Ai); at least one ethylenically unsaturated compound (Aii) containing at least two reactive groups capable to react with isocyanate groups; at least one hydrophilic compound (Aiii) containing at least one reactive group capable to react with isocyanate groups and which is capable to render the polyurethane prepolymer dispersible in aqueous medium either directly or after the reaction with a neutralizing agent to provide a salt; optionally, at least one active hydrogen-containing chain extender (Avii) capable to react with isocyanate groups and provide chain extension; and, optionally one or more polyol (Avi). In this aqueous dispersion, the ethylenically unsaturated polyurethane preferably has a viscosity of less than 2000 mPa·s and a weight average molecular weight of at least 2000 g/mol. The polyisocyanate (Ai) may be selected from aliphatic and cycloaliphatic polyisocyanates. The hydrophilic compound (Aiii) may selected from hydroxycarboxylic acids represented by the general formula $(HO)_xR(COOH)_y$, wherein R represents a straight or branched hydrocarbon residue having 1 to 12 carbon atoms, and x and y independently are integers from 1 to 3. The ethylenically unsaturated compound (Aii) may be selected from the reaction products of diglycidyl compounds with (meth)acrylic acid or from the diacrylate esters of bisphenol A diglycidylether. The active hydrogen-containing chain extender (Avii) may be selected from polyamines having up to 60 carbon atoms.

A particularly preferred aqueous dispersion comprises at least 90 wt % of high molecular weight ethylenically unsaturated polyurethane (A) and 0-5 wt % of one or more photoinitiator(s), wherein (A) has a viscosity of less than 2000 mPa·s and a weight average molecular weight of at least 2000 g/mol and is obtainable by a reaction of at least one polyisocyanate compound (Ai) selected from aliphatic and cycloaliphatic polyisocyanates; at least one ethylenically unsaturated compound (Aii) selected from the reaction products of diglycidyl compounds with (meth)acrylic acid or from the diacrylate esters of bisphenol A diglycidylether; at least one hydrophilic compound (Aiii) selected from hydroxycarboxylic acids represented by the general formula $(HO)_xR(COOH)_y$, wherein R represents a straight or branched hydrocarbon residue having 1 to 12 carbon atoms, and x and y independently are integers from 1 to 3; optionally, at least one active hydrogen-containing chain extender (Avii) selected from polyamines having up to 60 carbon atoms; and, optionally one or more polyol (Avi).

The Prepolymer

The prepolymer contained in the aqueous dispersion used in the method according to the present invention is water dispersible and contains at least one polymerizable carbon-carbon double bond. It may be simply referred to as "the prepolymer" herein. It can be cured, i.e. polymerized, thus resulting in a cured polymer.

The aqueous dispersion may contain the prepolymer as the only polymerizable component and may thus contain no polymerizable components other than the prepolymer. Alternatively, the aqueous dispersion may contain the prepolymer and other copolymerizable components, e.g. a chain extender, which may be monomeric. In that case, the final polymer is obtained e.g. by chain extension and by curing the polymerizable C—C double bonds. Chain extension may be carried out before curing and may be independent of curing. Preferably, chain extension and curing are carried out at the same time. In any case, all components necessary for preparing the polymer are preferably contained in the aqueous dispersion, and no component has to be added for carrying out the polymerization. In other words, the embossed and cured polymer is preferably obtainable in a process consisting of reducing the water content of the aqueous dispersion, embossing the dried dispersion, and curing the embossed dried dispersion.

The prepolymer is curable by heating or radiation, i.e. treating with UV light or electron beam. Preferably, the prepolymer is UV-curable. The radical polymerization may be initiated by the photoinitiator. Prior to curing the prepolymer, water contained in the aqueous dispersion is removed, usually by heating.

The prepolymer is preferably an oligomer having at least two, more preferably at least five or at least ten repeating units. The monomer units may be structurally identical or similar, or they can be different from each other.

The prepolymer having a polymerizable C—C double bond may be selected from the group consisting of acrylates, methacrylates, vinyl ethers, allyl ethers, propenyl ethers, alkenes, dienes, unsaturated esters, ally triazines, allyl isocyanates, and N-vinyl amides.

In the present invention, the term "acrylate" or "acrylic" should be understood to encompass "(meth)acrylate" or "(meth)acrylic", respectively.

The aqueous dispersion used in the present invention may contain a component having at least two thiol groups in addition to the prepolymer containing a C—C double bond. The double bonds of the prepolymer may react with the thiol-containing component to form a polymer. The component having at least two thiol groups is preferably a monomer and has two thiol groups. It may be contained in a quantity of 1 to 50 wt %, particularly of 5 wt % to 30 wt %, and the prepolymer having at least one polymerizable double bond may be contained in a total quantity of 1 wt % to 90 wt %, particularly of 40 wt % to 80 wt % in the aqueous dispersion (dry weight basis).

Herein, a percentage on a "dry weight basis" means the percentage based on the content of the solids, i.e. excluding water and, if present, other solvents.

The prepolymer may be an oligomer or polymer having a weight average molecular weight Mw of at least 2000 g/mol or even more than 5000 g/mol. A lower Mw results in a lower viscosity. The selection of molecular weights in relation to the functionality of the oligomers makes it possible to ensure the sufficiently rapid flow of the prepolymer into the stamp topography, through which particularly even extremely small structures can be safely and reliably molded.

The prepolymer contained in the aqueous dispersion is dispersible in an aqueous medium, preferably water. To that end, it has a certain degree of hydrophilicity. It preferably contains hydrophilic residues that are derived from corresponding hydrophilic compounds and are capable of rendering the prepolymer dispersible in aqueous medium either directly or after the reaction with a neutralizing agent to provide a salt. The hydrophilic compounds are generally selected from polyols comprising a functional group that can exhibit an ionic or non-ionic hydrophilic nature. Preferred is a polyol containing one or more anionic salt groups, such as a carboxylate and sulfonate salt groups or acid groups which may be converted to an anionic salt group, such as carboxylic acid or sulfonic acid groups. Preferred are hydroxycarboxylic acids represented by the general formula $(HO)_xR(COOH)_y$, wherein R represents a straight or branched hydrocarbon residue having 1 to 12 carbon atoms, and x and y independently are integers from 1 to 3. Examples of these hydroxycarboxylic acids include citric acid, malic acid, lactic acid and tartaric acid. The most preferred hydroxycarboxylic acids are the α,α-dimethylolalkanoic acids, wherein x=2 and y=1 in the above general formula, such as for example, 2,2-dimethylolpropionic acid and 2,2-dimethylolbutanoic acid. Usually the aqueous dispersion requires the preliminary neutralization of the hydrophilic residues provided by the hydrophilic compounds, such as the carboxylic acid or sulfonic acid groups, into salts. This is generally done by adding an organic or inorganic neutralizing agent, or mixtures thereof, to the prepolymer or the water. Suitable neutralizing agents include volatile organic tertiary amines such as trimethylamine, triethylamine, triisopropylamine, tributylamine, N,N-dimethylcyclohexylamine, N,N-dimethylaniline, N-methylmorpholine, N-methylpiperazine, N-methylpyrrolidine and N-methylpiperidine and non-volatile inorganic bases comprising monovalent metal cations, preferably alkali metals such as lithium, sodium and potassium and anions such as hydroxides, hydrides, carbonates and bicarbonates that do not remain in the aqueous dispersion as such. The total amount of these neutralizing agents can be calculated according to the total amount of acid groups to be neutralized. Generally, a stoichiometric ratio of about 1:1 is used.

The content of acid groups in the prepolymer of the aqueous dispersion is preferably 0.5 to 3.0%, more preferably 1.0 to 2.5% on a monomer units basis. Alternatively, the acid number of the prepolymer is preferably 5.0 to 30 mg KOH/g, more preferably 10 to 30 mg KOH/g. Hence, the article of the present invention preferably has these acid contents.

The prepolymer preferably has a number of double bond equivalents divided by the total mass of the prepolymer of less than 2.5 meq/g. As a result, the crosslinking density of the cured polymer is low.

Typical examples of prepolymers used in the present invention are water-dispersible urethane acrylate oligomers.

The prepolymer may have additional polymerizable groups. For instance, blocked isocyanate groups can be used. The isocyanate group is blocked with a protective group to prevent a reaction with the water of the dispersion. The protective group may be removed after drying the aqueous dispersion, and the isocyanate group may be reacted. Thus, dual curing may be carried out. C. Decker, R. Schwalm "Dual-Curing of Waterborne Urethane-Acrylate Coatings by UV and Thermal Processing", Macromol. Mater. Eng. 2003, 288, 17-28, describes a waterbased dual-cure urethane-acrylate oligomer that was synthesized by polycondensation of monomers bearing hydroxyl, isocyanate and acrylate groups. To obtain a stable aqueous dispersion, carboxylate groups were grafted on the oligomer chain and the isocyanate groups were protected by a blocking agent. After water release by a brief heating, the dry films were cure by a combination of short UV exposure in the presence of a photoinitiator to induce the polymerization of the acrylate double bonds, and heating up to 150° C. to release the isocyanates and promote the polycondensation by reaction with the hydroxyl groups.

The prepolymer used in the present invention is preferably selected from the group consisting of acrylates, methacrylates, vinyl ethers, allyl ethers, propenyl ethers, alkenes, dienes, unsaturated esters, ally triazines, allyl isocyanates, and N-vinyl amides, and more preferably selected from a group of acrylated oligomer or acrylated polymer compounds such as urethane acrylates, vinyl acrylates, epoxy acrylates, polyester acrylates, polyacrylates, polyether acrylates, olefin acrylates, acrylated oils and silicon acrylates. Urethane acrylates are particularly preferred.

Urethane acrylates which are useful in the present invention preferably are urethane acrylate oligomers. An especially preferred class of urethane acrylate oligomers includes di- or higher functional acrylate esters of hydroxyl-terminated NCO extended polyesters or polyethers which can be aliphatic or aromatic. Acrylated epoxy materials which are useful in the present invention preferably are acrylate epoxy oligomers. Acrylated epoxy oligomers include, for example, di- or higher functional acrylate esters of epoxy resins such as the diacrylate esters of bisphenol A epoxy resin. Acrylated epoxy resins tend to improve the tensile strength and elongation at break of the polymeric material obtained by curing the UV-curable precursor. Polyacrylates are acrylic oligomers or polymers that have reactive pendant or terminal acrylic acid groups capable of forming free radicals for subsequent reaction. Polyacrylate materials which are useful in the present invention preferably are polyacrylate polymers. Like the acrylated epoxy materials, the polyacrylates generally improve the tensile strength of the material obtainable by curing the UV-curable precursor. Similarly, acrylated olefin oligomers or polymers are unsaturated oligomeric or polymeric materials having reactive pendant or terminal acrylic acid groups capable of forming free radicals for crosslinking or chain extension. The acrylated olefins generally tend to improve the tensile strength and the elongation at break of the material obtained by curing the UV-curable precursor. Examples of useful acrylated olefins include polybutadiene acrylic oligomers. Polyester acrylate oligomers or polymers suitable in the present invention can be generally prepared by condensation reactions between acrylic acid and polyols or polyesters, respectively. Acrylated polyether resins tend to improve the flexibility and elongation at break of the elastomeric material obtained by curing the UV-curable precursor. Silicone acrylate oligomers or polymers tend to improve the elasticity and elongation of the structured surfaces but impair their tensile strength and robustness.

Higher functional silicone acrylates are often used due to their low surface energy properties.

The mechanical properties of the resulting structured surface are affected not only by the chemical composition of the curable oligomer or polymer but also by the respective crosslinking density. A higher crosslinking density usually results in a harder and more brittle material whereas a lower crosslinking density results in a softer and more conformable material.

The Reactive Diluent

The dispersion may contain a reactive diluent. It is reactive since it is polymerizable and becomes part of the molecule of the cured polymer structure, and it is a diluent since it reduces the viscosity of the dispersion. In particular, it reduces the viscosity of the dried dispersion. Preferably, the reactive diluent has at least one polymerizable double bond. The reactive diluents are polymerizable with the prepolymer used in the present invention to form the copolymerized elastomeric network of the cured polymeric material in the structured surface of the article of the present invention.

The reactive diluent preferably has a weight average molecular weight Mw of less than 500 g/mol and thus differs from the prepolymer having a weight average molecular weight Mw of more than 2000 g/mol. In any case, the reactive diluent differs in its structure from the prepolymer and the surfactant, if contained.

The reactive diluent may be selected from the group consisting of aliphatic (meth)acrylates or polyether(meth) acrylates, particularly HDDA or TMP(EO)xTA. It is possible to use a multifunctional aliphatic or polyether(meth) acrylate, particularly TMP(EO)9TA, TMP(EO)6TA, TMP (EO)3TA or TMPTA is contained as a reactive diluent to specifically adjust the hardness of the polymer composition in addition to the viscosity of the aqueous dispersion and/or dried dispersion.

The Surfactant

The aqueous dispersion used in the present invention contains at least one surfactant that functions as a surface-active anti-adhesive in the embossing process. In other words, the surfactant is a surface-active anti-adhesive.

The surfactant is a compound different from the prepolymer and the reactive diluent, if present, and has the effect of lowering the surface energy of the dry material. Hence, the surface energy of the dry material containing the surfactant is lower than the surface energy of the dry material free of the surfactant.

Generally, the surfactant may be contained in the aqueous dispersion (i) as a component in addition to the prepolymer and/or (ii) as a constituent of the prepolymer molecule. In the case of (i), it is preferably polymerizable with the prepolymer upon curing in step (e) of the method of the present invention. Preferably, the surfactant has a polymerizable carbon-carbon double bond. In the case of (ii), it structurally differs from the other constituents of the prepolymer.

In one embodiment, the aqueous dispersion used in the present invention contains at least one surfactant selected from the group consisting of alkyl-(meth)acrylates, polysiloxane (meth)acrylates, perfluoroalkyl (meth)acrylates, perfluoropolyether (meth)acrylates, alkyl vinyl ethers, polysiloxane vinyl ethers, perfluoroalkyl vinyl ethers, and perfluoropolyether vinyl ethers. In this embodiment, the prepolymer and the optionally contained reactive diluent are not selected from said group.

At least one curable surfactant selected from the group consisting of alkyl-(meth)acrylates, poly-siloxane (meth) acrylates, perfluoroalkyl (meth)acrylates, and perfluoropolyether (meth)acrylates may be preferred. The surfactant preferably contains perfluoropolyether groups or fluoroalkyl groups, more preferably perfluoropolyether groups or fluoroalkyl groups and (meth)acrylate in its molecule. The surfactant may have polysiloxane groups or a perfluorinated carbon groups in its molecule.

The aqueous dispersion preferably contains, on a dry weight basis, the surfactant in a quantity of 0.01 wt % to 10 wt %, particularly 0.1 wt % to 3 wt %. This ensures that the surface energy of the prepolymer composition is reduced to such an extent that additional generations of patterns can be repeatedly drawn through embossing or molding without defects.

EXAMPLES

The present invention will be illustrated by the following examples.

(1) Examples of Aqueous Dispersions Used in the Present Invention

Table 1 illustrates the advantages of the aqueous dispersion used in the present invention. The aqueous dispersion has a low viscosity and thus does not require the addition of monomers to reduce the viscosity. The low amount of double bond equivalents results in a low degree of crosslinking after curing.

TABLE 1

| | Prepolymer composition | Viscosity [mPa · s] | Molecular weight [g/mol] | Monomer [wt %] | Double bond equivalents [meq/g] |
|---|---|---|---|---|---|
| Dispersion used in the present invention | Aqueous dispersion of UA | 150 | 3,000 | — | 2.12 |
| Comparative formulations | A | 58,000 | 1,400 | THFA 5% | 2.36 |
| | B | 16,000 | 520 | HDDA 28% | 14.94 |
| | | 1,000 | 500 | | |
| | | 20 | 450 | | |
| | C | 1,100 | 550 | THFA 15% | 5.52 |
| | D | 25,000 | | n-OA 25% | 2.78 |
| | E | 12,500 | 1,000 | n-OA 25% | 2.93 |
| | F | 2,000 | 900 | n-OA 10% | 2.23 |

Resins:

A: aliphatic trifunctional UA; B: dipenta-pentaacrylate (16,000 mPa·s), bisphenol A diacrylate (1,000 mPa·s), TPGDA-diethylamine (½) (20 mPa·s); C: modified epoxy acrylate; D: aliphatic trifunctional UA; E: aliphatic difunctional UA; F: aliphatic difunctional UA.

Monomers:

THFA: tetrahydrofurfuryl acrylate; HDDA: 1,6-hexanediol diacrylate; n-OA: n-octyl acrylate. Other compositions usable in the present invention are shown in the following Table 2.

TABLE 2

| No. | Component | | Parts | Viscosity (mPa · s) | Content of solids (wt %) | meq/g |
|---|---|---|---|---|---|---|
| 1 | Ucecoat 7700 | water based UA | 97 | 150 | 35 | 2.12 |
| | ADDITOL VXW 6396 | leveling additive | 1 | | | |
| | GENOCURE* DMHA (Rahn) | 2-hydroxy-2-methyl-1-phenyl-1-propanone | 1 | | | |
| | TEGO RAD2200N (Evonik) | silicone acrylate | 1 | | | |
| 2 | Ucecoat 7788 | water based UA | 97 | 250 | 40 | 1.95 |
| | ADDITOL VXW 6396 | leveling additive | 1 | | | |
| | GENOCURE* DMHA (Rahn) | 2-hydroxy-2-methyl-1-phenyl-1-propanone | 1 | | | |
| | TEGO ® Twin 4100 (Evonik) | siloxane based Gemini surfactant | 1 | | | |
| 3 | Ucecoat 7230 | water based UA | 97 | 150 | 42 | 1.81 |
| | ADDITOL VXW 6396 | leveling additive | 1 | | | |
| | GENOCURE* TPO-L (Rahn) | ethyl(2,4,6-trimethylbenzoyl) phenylphosphinate | 1 | | | |
| | Fluowet AC600 (Archroma) | perfluorhexyl-ethylacrylat | 1 | | | |
| 4 | Ucecoat 7770 | water based UA | 97 | 50 | 35 | 2.16 |
| | ADDITOL VXW 6396 | leveling additive | 1 | | | |
| | Irgacure 2959 (BASF) | 2-hydroxy-4'-(2-hydroxyethoxy)-2-methylpropiophenone | 1 | | | |
| | TEGO ® Rad 2250 (Evonik) | silicone acrylate | 1 | | | |
| 5 | Ucecoat 7700 | water based UA | 97 | 150 | 35 | 2.12 |
| | ADDITOL VXW 6396 | leveling additive | 1 | | | |
| | Irgacure 2959 (BASF) | 2-hydroxy-4'-(2-hydroxyethoxy)-2-methylpropiophenone | 1 | | | |
| | Ebecryl 350 | silicone acrylate | 1 | | | |

(2) Preparation of an Article According to the Invention

An embossed structure was prepared from an aqueous dispersion as follows:

UCECOAT7700 (solvent-free aqueous UA oligomer dispersion)+1% KL200 (photoinitiator)+1% Additol VXW (leveling additive)+1% RAD2200N (silicone acrylate)

Melinex 506 film, 125 μm thick baked at 100° C. for 5 min; result: tack-free.

molded with nickel-riblet female stamp by batch imprinting curing with UV table lamp (wavelength: 365 nm), illumination through foil In another example, good imprinting results were achieved with the above-described aqueous dispersion formulation in a R2R-UV-NIL-process at a web speed of 4 m/min. The aqueous dispersion formulation was applied to a Melinex 506 substrate web by means of R2R gravure coating and it was tack free after passing a one-meter-long drying stretch at T=100° C. Then it was R2R embossed by a female riblet nickel roller shim and cured by UV-light (λ=365 nm) through the web.

The results showed that an aqueous dispersion used in the method according to the present invention can be used for preparing embossed structures.

What is claimed is:

1. A method of preparing an article having a micro- or nanostructured surface, the method comprising the following steps:

(a) providing an aqueous dispersion of a prepolymer having at least one polymerizable carbon-carbon double bond, wherein the aqueous dispersion contains, on a dry weight basis, 0 wt % to less than 2 wt % of reactive diluents that are monomers having at least one polymerizable carbon-carbon double bond, wherein the viscosity of the aqueous dispersion is less than 2000 mPas, wherein the aqueous dispersion contains 50 to 70 wt % of water and 30 to 50 wt % of prepolymer, and a combined total weight of water and the prepolymer makes up 80 to 100 wt % of the aqueous dispersion, (b) applying a film of the aqueous dispersion on the surface of a substrate, (c) drying the film, (d) embossing the dried film, without embossing the substrate, to form micro- or nanostructures on the surface of the dried film, and (e) curing the embossed film to obtain the article having a micro- or nanostructured surface.

2. The method according to claim 1, wherein the prepolymer is selected from the group consisting of urethane acrylates, epoxy acrylates, polyester acrylates, polyacrylates, polyether acrylates, and polyolefin acrylates.

3. The method according to claim 1, wherein the prepolymer contains hydrophilic residues selected from acidic or ionic residues.

4. The method according to claim 3, wherein the hydrophilic residues are selected from the group consisting of carboxylic acid, sulfonic acid, carboxylate and sulfonate residues.

5. The method according to claim 1, wherein the weight average molecular weight of the prepolymer is at least 2000 g/mol.

6. The method according to claim 1, wherein the aqueous dispersion contains, on a dry weight basis, 0 wt % to less than 0.1 wt % of a reactive diluent that is a compound different from the prepolymer.

7. The method according to claim 6, wherein the reactive diluent is a monomer having a weight average molecular weight Mw of less than 500 g/mol.

8. The method according to claim 6, wherein the aqueous dispersion contains a surfactant that is a compound different from the prepolymer and from the reactive diluent and that is selected from the group consisting of alkyl-(meth)acrylates, poly-siloxane (meth)acrylates, perfluoroalkyl (meth) acrylates, perfluoropolyether (meth)acrylates, alkyl vinyl ethers, polysiloxane vinyl ethers, perfluoroalkyl vinyl ethers, and perfluoropolyether vinyl ethers.

9. The method according to claim 8, wherein the aqueous dispersion contains, on a dry weight basis, 0.1 wt % to 3 wt % of the surfactant.

10. The method according to claim 1, wherein the dried film has a surface energy of 10 mN/m to 40 mN/m.

11. The method according to claim 1, wherein the prepolymer is a urethane acrylate containing hydrophilic residues selected from the group consisting of carboxylic acid, sulfonic acid, carboxylate and sulfonate residues, wherein the weight average molecular weight of the prepolymer is at least 2000 g/mol, the aqueous dispersion contains less than 2 wt % of a monomeric reactive diluent, and wherein the prepolymer is cured by UV radiation.

12. The method according to claim 1, wherein the prepolymer has a number of double bond equivalents divided by the total mass of the prepolymer of less than 2.5 meq/g.

13. An article having a micro- or nanostructured surface obtainable by the method of claim 1.

14. The use of an article having a micro- or nanostructured surface of claim 13 in shark skin technology, moth eye technology, antifouling technology and diffractive or refractive light-guiding and superhydrophobic surface technology.

* * * * *